United States Patent [19]
Klein

[11] Patent Number: 6,006,310
[45] Date of Patent: *Dec. 21, 1999

[54] SINGLE MEMORY DEVICE THAT FUNCTIONS AS A MULTI-WAY SET ASSOCIATIVE CACHE MEMORY

[75] Inventor: Dean A. Klein, Lake City, Minn.

[73] Assignee: Micron Electronics, Inc., Nampa, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/531,134

[22] Filed: Sep. 20, 1995

[51] Int. Cl.$^6$ .................................................. G06F 12/00
[52] U.S. Cl. ................................. 711/128; 711/5; 711/3; 711/108; 365/49
[58] Field of Search ............................. 365/49; 395/435, 395/455; 711/108, 128, 2, 3, 5

[56] References Cited

U.S. PATENT DOCUMENTS

| | | | |
|---|---|---|---|
| 4,149,239 | 4/1979 | Jenkins et al. | 395/435 |
| 4,905,188 | 2/1990 | Chuang et al. | 711/128 |
| 4,930,104 | 5/1990 | Nakagawa et al. | 365/49 |
| 5,210,845 | 5/1993 | Crawford et al. | 395/425 |
| 5,430,687 | 7/1995 | Hung et al. | 365/230.08 |
| 5,485,418 | 1/1996 | Hiraki et al. | 365/49 |
| 5,488,709 | 1/1996 | Chan | 395/445 |
| 5,826,052 | 10/1998 | Stiles et al. | 395/381 |

FOREIGN PATENT DOCUMENTS 0 335 113 A2  10/1989  European Pat. Off. .
0 549 508 A1  6/1993  European Pat. Off. .

OTHER PUBLICATIONS

D. Patterson and J. Hennessy, "Computer Organization & Design The Hardware/Software Interface," Morgan Kaufmann. Publishers, Inc, pp. 501–514.

Micron, "1996 SRAM Data Book", Micron. Technology, Inc, 1996, pp. 1–165 to 1–169.

*Primary Examiner*—Eddie P. Chan
*Assistant Examiner*—Hong C. Kim
*Attorney, Agent, or Firm*—Trop, Pruner, Hu & Miles, P.C.

[57] ABSTRACT

A memory device provides for multi-way set associative burst SRAM (static random access memory) cache memory in a single device or package. In one embodiment input address bit A2 is used to generate a bank select signal rather than as a direct input to the SRAM's memory array element. This, in combination with additional output registers and output buffers creates a two-way set associative cache memory in a single memory device. In an alternative embodiment, input address bits A2 and A3 are used to generate bank select signals rather than as direct input to the SRAM's memory array element. This, in combination with additional output registers, output buffers, and an output bank decoder creates a four-way set associative cache memory in a single memory device. Additionally, a mode circuit is provided that controls whether the memory device operates as a multi-way set associative memory or as a conventional direct-mapped memory device. The mode circuit provides backwards compatibility with existing burst SRAM devices.

23 Claims, 7 Drawing Sheets

SINGLE MEMORY DEVICE THAT FUNCTIONS AS A MULTI-WAY SET ASSOCIATIVE CACHE MEMORY

1. FIELD OF THE INVENTION

The invention relates in general to the field of solid-state memory storage devices and, more particularly, to burst static random access (SRAM) memories. Specifically, the invention describes a synchronous burst SRAM solid-state cache memory capable of multi-way set associative operation within a single device. The inventive memory device also provides a mode of operation that makes it backwards compatible with standard burst SRAM devices.

2. BACKGROUND OF THE INVENTION

Contemporary high-speed computer system designs make use of a series of different memories, arranged in a hierarchy, to provide the system's central processing unit with needed memory read (retrieval) and write (update) capabilities. As shown in FIG. 1 a typical memory hierarchy 100 comprises four levels of memory: level 1, internal cache memory 110; level 2, external cache memory 115; level 3, main memory 120; and level 4, long term memory 125.

Level 1's internal cache memory 110 provides the fastest performance but is also the most severely space restricted because of its placement internal (i.e., on the same chip) as the computer system's central processor unit 105. Because of this space limitation, internal cache's are used to store only those instructions and data most commonly used by the processor. Typical internal cache sizes vary from 8 KB (kilobyte) to 32 KB.

Secondary or level 2 cache memory 115 is provided to increase computer system performance when the processor 105 requires information not stored in the internal cache 105. Sizes for level 2 caches vary greatly depending upon system requirements such as operational speed and architecture (e.g., pipelined versus non-pipelined).

Level 3 memory is the largest portion of RAM (random access memory) and is typically implemented in DRAM (dynamic random access memory) technology. A key feature of level 3 memory is that it is significantly slower than level 2 cache memory. Main memory is characterized by the need to implement wait-states between memory read or write commands and the actual reading (retrieval) or writing of the specified memory locations. Typical main memory sizes range from 64 KB to 512 MB (megabyte).

Level 4 memory is also referred to as long term or permanent storage and is typically implemented using magnetic or optical hard disks or, magnetic floppy disks.

2.1 Burst SRAM Devices

New medium and high end personal computers, as well as most if not all workstation and main-frame computers, utilize level 2 external cache memory to obtain a reasonable level of performance. A current trend in computer memory system design is to implement level 2 cache memory in synchronous burst SRAM technology. As would be known to one of ordinary skill in the field of memory system design, the goal of burst SRAM devices is to provide a large array of fast static random access memory with on-chip control circuitry to automatically retrieve a limited sequence of consecutive memory read addresses. For example a four-word burst SRAM, given read address X, would not only retrieve the data at memory location X, but would also automatically retrieve those data at memory locations (X+1), (X+2), and (X+3) without the host processor having to generate any of the read addresses (X+1), (X+2), or (X+3). (One of ordinary skill in the art will realize that different processors can generate different burst sequences.) Similarly, a four-word burst SRAM is capable of receiving and storing four data words from the processor 105 in rapid succession.

By way of illustration, the Micron MT58LC32K36B4 (a 32K×36 SRAM having a two-bit burst controller) synchronous SRAM will be described. As shown in FIG. 2, the basic elements of the burst SRAM device 200 consist of an input address data latch 205, a burst counter 210, the 32K×36 SRAM array 215, SRAM array output register 220, output buffer 225, and appropriate read/write control logic 230.

During a read operation, external address input A0–A14 are captured by address latch 205. Low order address bits A0 and A1 are then split off (indicated as LA0 and LA1 in FIG. 2) and supplied as input to the two-bit burst counter 210. The function of the burst counter is to generate an appropriate sequence of address bit values on lines IA0 and IA1 to step-through four consecutive memory locations. The precise sequence of values on lines IA0 and IA1 are dependent upon the memory's operation and is controlled by an externally applied signal (not shown). Typically, the burst counter can generate a sequence of IA0 and IA1 bit patterns to implement either an interleaved or linear-burst address scheme. As would be known to those of ordinary skill, the former mode is suitable for use in a computer system using an Intel "PENTIUM" processor while the latter is suitable for use with non-Intel processors.

Address latch 205 output (IA2–IA14, representing input address bits A2 through A14 respectfully) is applied, in combination with burst counter 210 output IA0 and IA1, to the SRAM array 215. Output from the SRAM array is supplied to an output register 220. In turn, output from the output register is applied to an output buffer 225 where it is supplied to an external data bus.

Data write operations are performed in a similar manner. An external address is stored into address latch 205 whose output, in combination with burst counter 210 output, is applied to the SRAM array 215. Externally supplied data is then stored into the SRAM array under control of read/write control logic 230.

2.2 Associative Memory Caches

It is widely known that implementing a cache using associative access techniques improves the performance of a memory. In fact, many systems employ a two-way set associative memory scheme in their level 2 external cache 115. It is also known that increasing the associativity (e.g., from two-way to four-way) of the external cache memory can result in significantly higher system performance. This is especially true in systems with small internal caches (e.g., 110) which execute multi-threaded operating systems such as Unix or Microsoft "WINDOWS" because of paging mechanisms as the processor jumps from task to task.

The reason for this increased performance, when using a set associative cache memory 115, is the reduction of cache line replacements. For example, in a computer system employing an external direct-mapped cache, cache lines may have to be replaced for any two memory accesses a multiple of the cache size apart. In general, for an n-way set associative cache of size m, cache lines may have to be replaced for the (m+1)th memory access a distance of (m÷n) memory locations (e.g., bytes) apart. This reduction in cache line replacements results in an increase in system performance. Furthermore, if an LRU (least recently used) replacement algorithm is used to determine which line should be replaced, it is likely that the data most likely to be accessed will still be in the cache in the next cache access.

Current pipelined and burst SRAMs are generally designed to allow bursts of four words into, and out of, the memory. (See FIG. 2 and discussion above.) Using these devices a two-way set associative cache memory can be implemented by doubling the number of memory devices; one physical device is used to implement one set of a two-way set associative memory, and another physical device is used to implement the second set. If Micron MT58LC32K36B4 memory devices are used in such a scheme, the resulting cache memory would have a 32K×36 depth (for each set), for a total memory of 128 KB. Implementation of a four-way set associative memory would require four such memory devices. While the increased memory size can improve system performance, the space (i.e., printed circuit board space) needed to implement such a memory as well as the increased power necessary to drive such a system are drawbacks to the current method of implementing set associative memory caches.

The memory device described herein modifies existing SRAM devices to allow multi-way set associative memory operations within a single memory device. For example, a Micron MT58LC32K36B4 modified in accordance with the invention can implement a two-way set associative memory with each set having a depth of 16 K-words (KW). Alternatively, a four-way set associative memory could be implemented in a modified MT58LC32K36B4 with each set having a depth of 8 KW.

3. SUMMARY OF THE INVENTION

A memory device in accordance with the invention provides for multi-way set associative burst SRAM (static random access memory) cache memory in a single memory device or package. In one embodiment, input address bit A2 is used to generate a bank select signal rather than as a direct input to the SRAM array. This, in combination with an additional output register and output buffer creates a two-way set associative cache memory in a single device. In an alternative embodiment, input address bits A2 and A3 are used to generate bank select signals rather than as a direct input to the SRAM array. This, in combination with three additional output registers and output buffers creates a four-way set associative cache memory in a single device. Additionally, a mode circuit is provided that controls whether the inventive memory device operates as a multi-way set associative memory or a conventional direct-mapped memory device. The mode circuit provides the inventive memory device with backwards compatibility with existing burst SRAM devices.

4. BRIEF DESCRIPTION OF DRAWINGS

5. DETAILED DESCRIPTION OF SPECIFIC EMBODIMENTS

One illustrative embodiment of the invention is described below as it might be implemented using burst SRAM (static random access memory) technology. In the interest of clarity, not all features of an actual implementation are described in this specification. It will of course be appreciated that in the development of any such actual implementation (as in any engineering design project), numerous implementation-specific decisions must be made to achieve the developers' specific goals, such as compliance with system- and business-related constraints, which will vary from one implementation to another. In particular, parameters such as clock rate, rise, setup and skew times, as well as memory propagation delays, circuit loading and capacitive considerations must be addressed to actually implement, in silicon or other suitable material, an actual memory device in accordance with the invention. Moreover, it will be appreciated that such a development effort might be complex and time-consuming, but would nevertheless be a routine undertaking of computer memory design for those of ordinary skill having the benefit of this disclosure.

5.1 Two-Way Set Associative Embodiment

Figure 3:
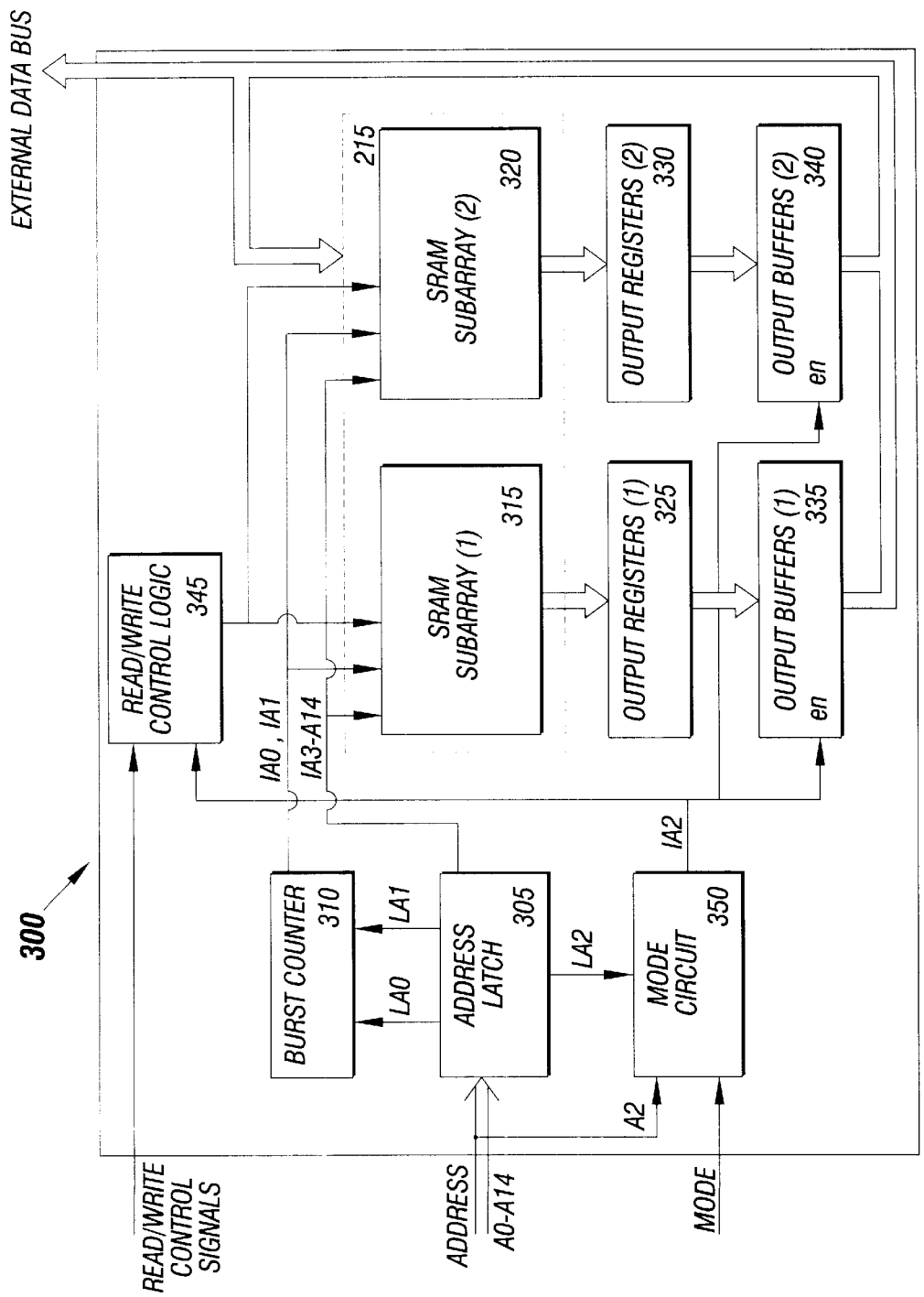
FIG. 3 is a block diagram of a two-way set associative memory device in accordance with the invention.

FIG. 3 shows a block diagram of a Micron MT58LC32K36B4 (or similar device) modified in accordance with the invention to implement a two-way set associative memory device 300. Basic elements of the memory device include an address data latch 305, a burst counter 310, SRAM subarray(1) 315, SRAM subarray(2) 320, output registers 325 and 330, output buffers 335 and 340, read/write control logic 345, and mode circuit 350. As would be known in the art, each of the above-listed components are operatively coupled (i.e., connected or configured to function in the manner described below when the memory device is operated).

Functional distinctions between the inventive memory device and conventional burst SRAM devices include (1) the memory array (e.g., array 215) is evenly divided between two subarrays, 315 and 320; (2) an internal representation of input address bit A2 (denoted as IA2) is used to select the appropriate output buffer during read operations, and (3) the IA2 signal is used to select the appropriate memory subarray during write operations via the read/write control logic 345. Thus, input address signal A2 is not supplied directly to the memory array (combination of subarrays 315 and 320) but instead is used to generate a "bank select" signal.

Mode circuit 350 allows the memory device to operate in a consistent manner with previous technology. That is, it provides the ability to put the memory device into either a backwards compatibility mode (operating functionally as a conventional device) or as a two-way set associative mode. A detailed discussion of mode circuit 350 is provided in Section 5.3.

Figure 1:
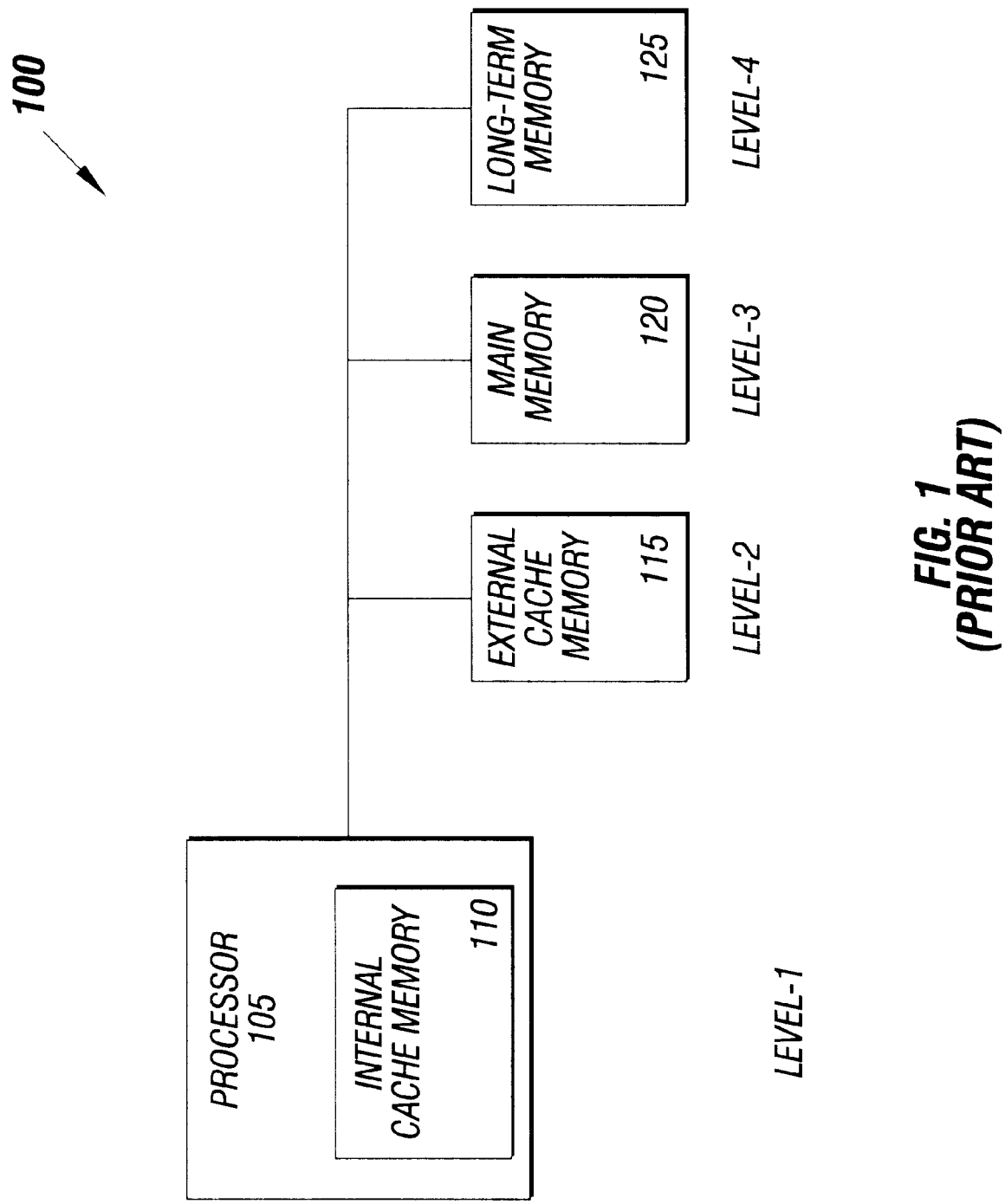
FIG. 1 is a block diagram of a conventional memory hierarchy scheme.
Figure 2:
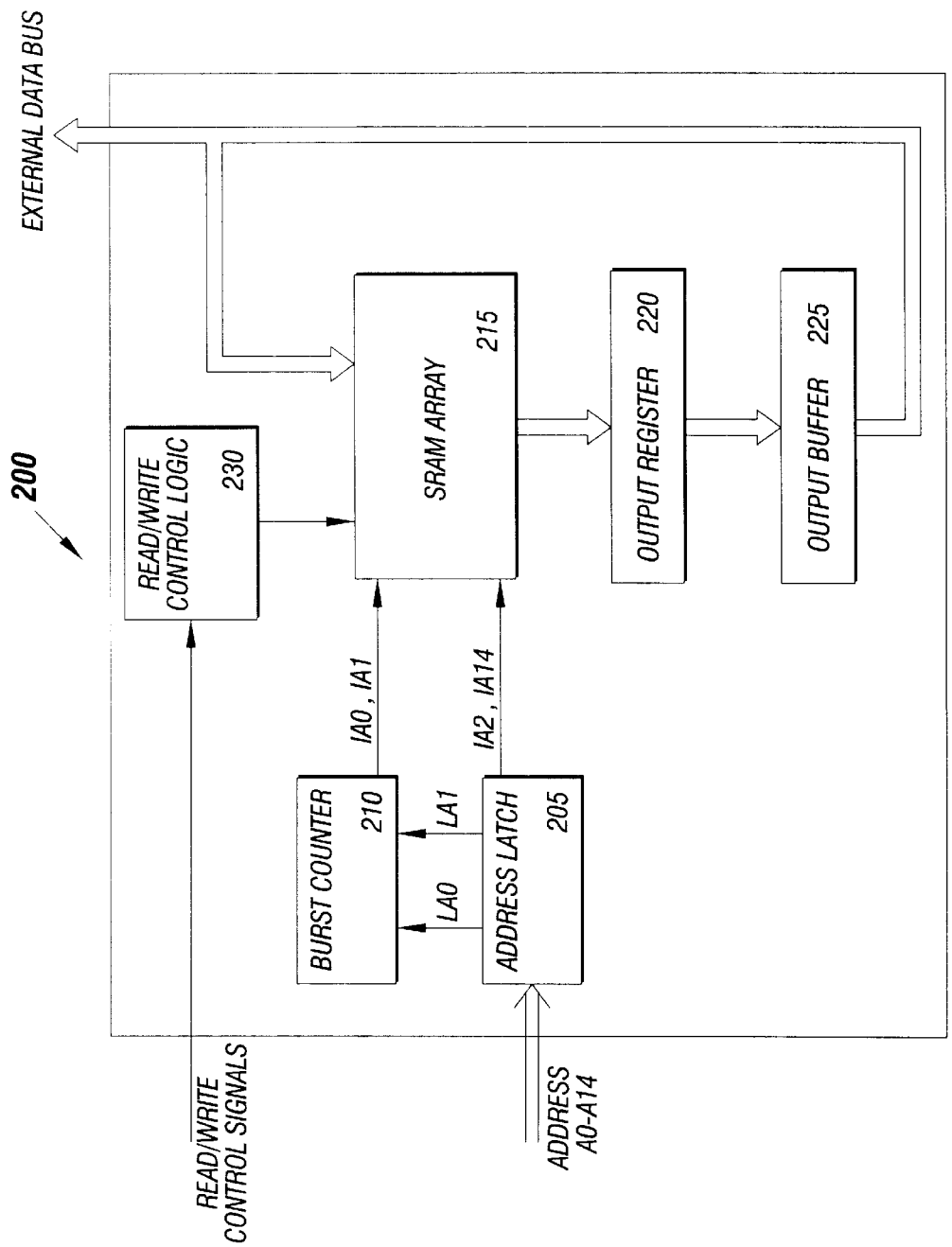
FIG. 2 is a block diagram of a conventional burst SRAM device.

A consequence of dividing the SRAM array in the manner shown in FIG. 3 is that an additional set of output registers (e.g., 330) and output buffers (e.g., 340) are needed compared to prior art SRAM devices (see FIG. 2). The benefit, however, is that a two-way set associative cache memory is implemented in a single device package.

It is noteworthy that to implement a set associative memory, it is important to select the subarray to be read from at the output point (e.g., the output buffers 335 or 340) and not at the time the memory is addressed (e.g., by using address input signal A2). On the other hand, during a write operation it is appropriate to selectively enable the subarrays.

As in prior art devices, burst counter 310 receives address latch 305 output representative of input address bits A0 and A1 (denoted as LA0 and LA1) and generates an appropriate sequence of address bit values on lines IA0 and IA1 to step-through four consecutive memory locations. As previously discussed, the precise sequence of values on lines IA0 and IA1 are dependent upon the memory's operation (interleaved or linear) and can be controlled by an externally applied control signal (not shown).

Data write operations are also performed in a fashion substantially similar to that of prior art memories. An external address is stored into address latch 305 and, in combination with burst counter 310 output supplies the memory array (comprised of subarray(1) 315 and subarray (2) 320) with input indicative of IA0, IA1, and IA3–IA14. Signal IA2 from the mode circuit 350 is routed to read/write control logic 345 which is responsible for selectively enabling which SRAM subarray to enable for a write operation.

It will be appreciated by those of ordinary skill that a number of control signals (not shown) are also provided to the SRAM device 300. These signals include, but are not limited to, BYTE WRITE and GLOBAL WRITE ENABLE signals, various CLOCK input signals, processor and memory STATUS signals, and power signals. While it is essential that some or all of these signals be present for operation, the central concept of the memory is as described above.

It is further noted that while output registers (325 and 330) and output buffers (335 and 340) are each shown as single elements in FIG. 3, they may be actually be implemented as a series of registers or buffers. Regardless of their implementation however, their function is the same—to provide temporary storage for data retrieved from the SRAM subarrays (315 and 320) before being delivered to the memory device's data output port, or pins.

5.2 Four-Way Set Associative Embodiment

Figure 4:
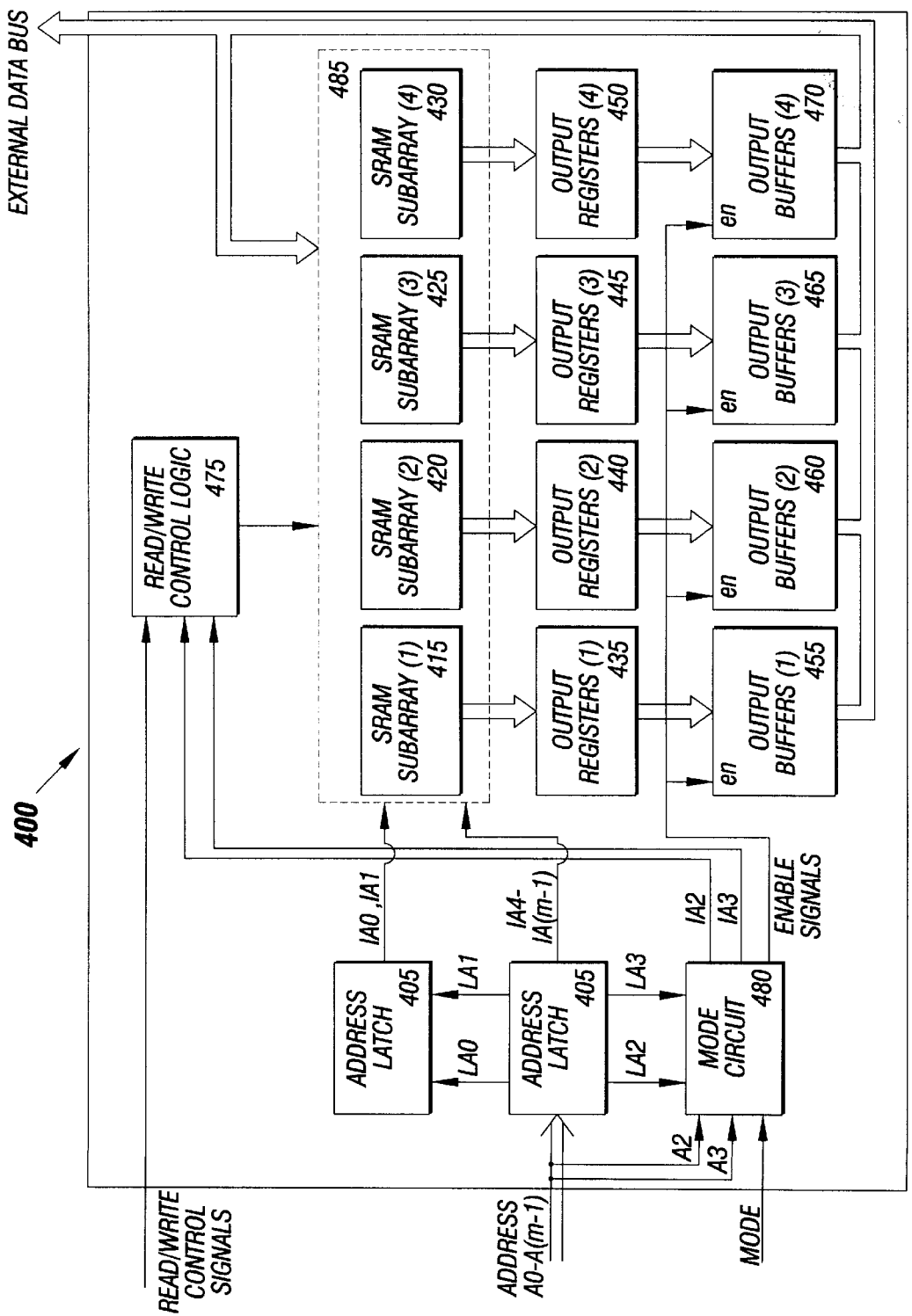
FIG. 4 is a block diagram of a four-way set associative memory device in accordance with the invention.

It would be apparent to one of ordinary skill in the art having the benefit of this disclosure that extensions to the above example could easily be made. As shown in FIG. 4 for example, a four-way set associative memory device 400 can be implemented by addressing the SRAM array 485 with address bits IA0, IA1, and IA4 through IA(m−1), where m represents the width of the device's address bus. This arrangement creates four equal sized memory subarrays.

In this embodiment address bits A2 and A3, through the mode circuit 480 and read/write control logic 475 selectively enable individual memory subarrays (415, 420, 425, 430) and output buffers (455, 460, 465, 470) during memory read and write operations. A detailed description of the mode circuit is provided in Section 5.3. All essential operational characteristics of this embodiment are the same as for the two-way set associative memory described above.

5.3 Backwards Compatibility

The mode circuit (350 or 480) is designed to allow a memory device in accordance with the invention to operate in one of a plurality of modes. One mode being backward compatible with existing single memory array (i.e., direct mapped) memory devices such as the Micron MT58LC32K36B4 device.

Figure 5:
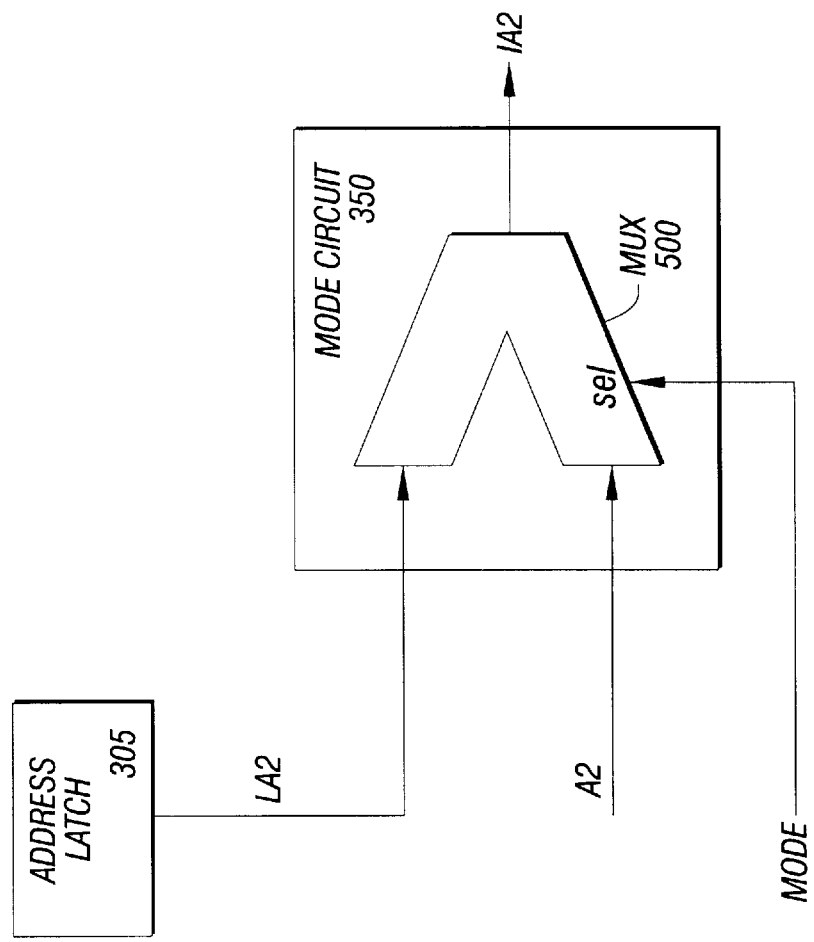
FIG. 5 shows a block diagram for a mode circuit applicable to a two-way set associative memory device in accordance with the invention.

An expanded circuit diagram for the mode circuit 350 is shown in FIG. 5. If the input mode signal is asserted, then the MUX 500 selects the A2 signal for supply to the output buffers 335 and 340 and read/write control logic 345. If the input mode signal is not asserted, the MUX 500 selects the LA2 signal for supply to the output buffers 335 and 340 and read/write control logic 345. In this latter mode, the inventive memory device becomes compatible with existing memory devices (i.e., Micron MT58LC32K36B4). To ensure the inventive memory device is plug-compatible with existing memories, the mode input corresponds to an input pin not currently used in those prior art memories. Further, the mode pin can have an internal pull-up resistance holding it in the not-asserted mode.

Figure 6A:
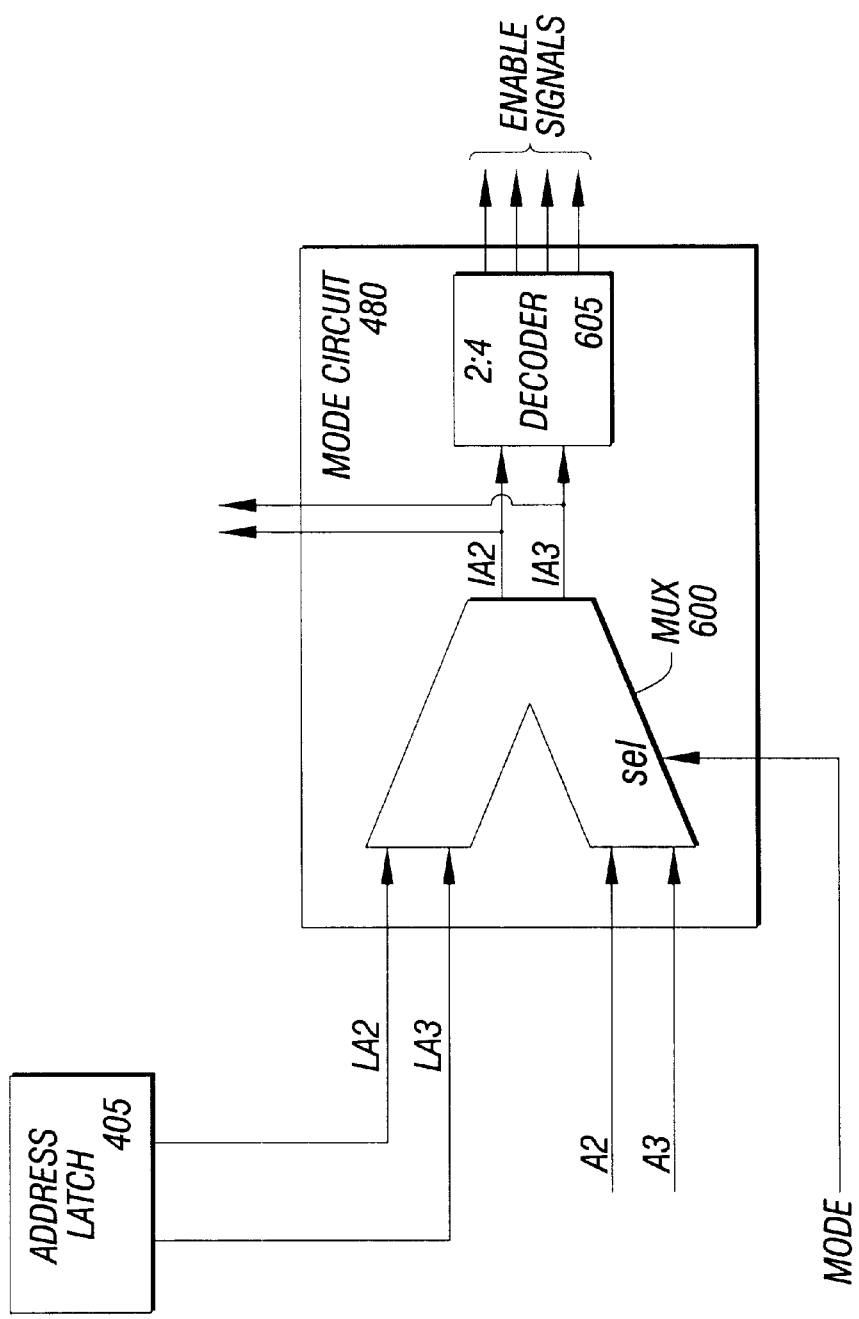
FIGS. 6A and 6B show block diagrams of alternative embodiments for a mode circuit applicable to a four-way set associative memory device in accordance with the invention.

FIG. 6A shows an expanded block diagram of the compatibility circuit 480. In this embodiment if the input mode signal is asserted, then the MUX 600 selects the A2 and A3 signals for supply to the read/write control logic 475 and the 2:4 decoder 605. If the input mode signal is not asserted, then the MUX 600 selects the LA2 and LA3 signals for supply to the read/write control logic 475 and the 2:4 decoder 605. In either case, the 2:4 decoder decodes the MUX's output to generate four enable signals which are supplied to the output buffers 455, 460, 465, and 470. If the mode signal is not asserted, the inventive memory device becomes compatible with existing memory devices (i.e., a direct-mapped memory device such as Micron MT58LC32K36B4). To ensure the inventive memory device is plug-compatible with existing memories, the mode input corresponds to an input pin not currently used in those prior art memories. Further, the mode pin has an internal pull-up holding it in the not asserted mode.

Figure 6B:
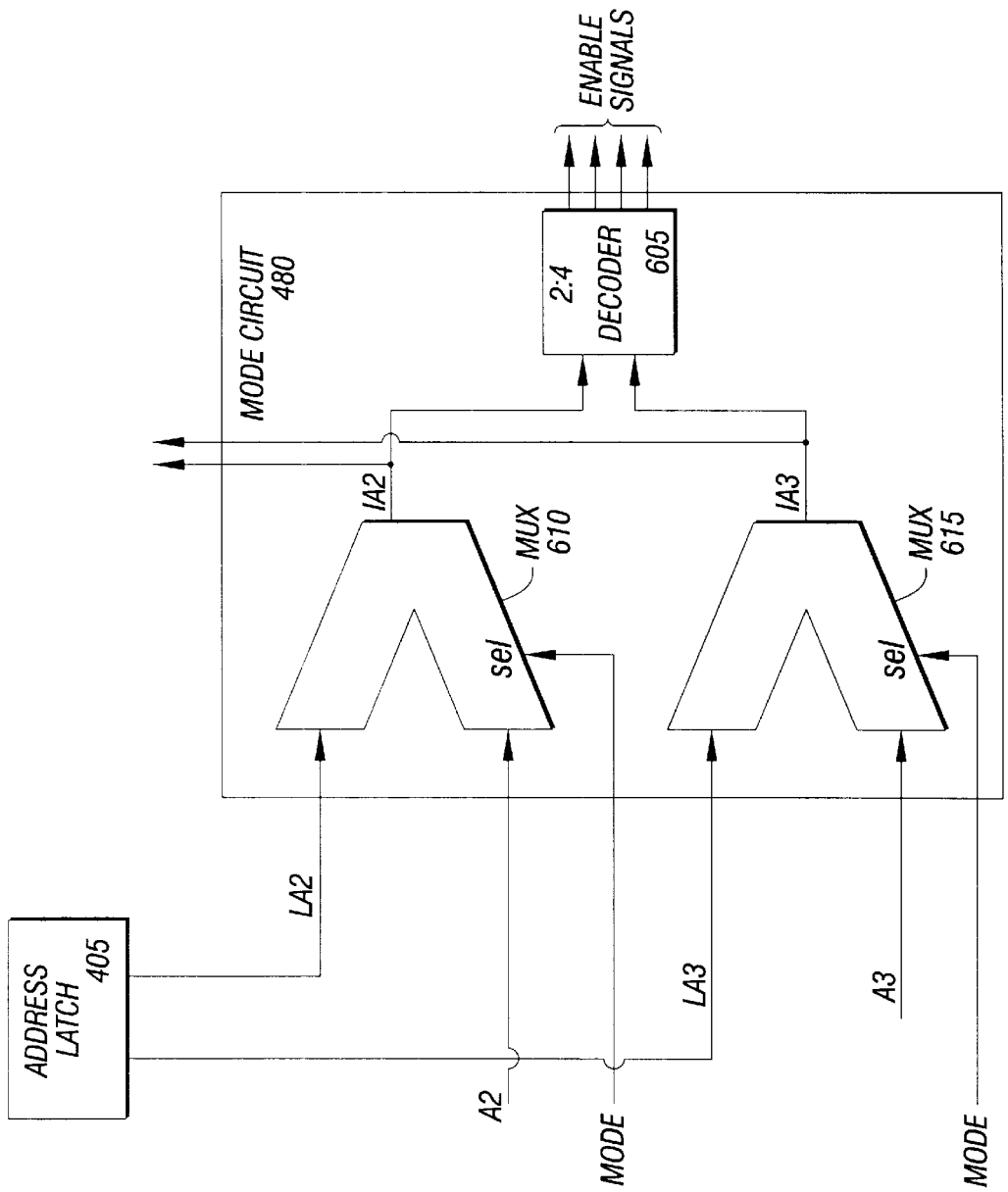

FIG. 6B shows an alternative embodiment for the mode circuit 480. In this embodiment there are two mode input signals, Mode0 and Mode1. If Mode0 is asserted and Mode1 is not asserted, then the memory behaves as the two-way set associative memory described above. If Mode0 and Mode1 are asserted, then the memory behaves as a four-way set associative memory as described above. If neither Mode0 or Mode1 are asserted, the inventive memory device becomes compatible with existing memory devices (i.e., a direct-mapped memory device such as Micron MT58LC32K36B4). FIG. 6B's operation is summarized in Table 1.

TABLE 1

| Mode1 | Mode0 | IA2 | IA3 | Operation |
|---|---|---|---|---|
| Not Asserted | Not Asserted | LA2 | LA3 | Backwards compatible-direct mapped. |
| Not Asserted | Asserted | A2 | LA3 | Two-way set associative operation. |
| Asserted | Not Asserted | — | — | UNDEFINED |
| Asserted | Asserted | A2 | A3 | Four-way set associative operation |

To ensure the inventive memory device is plug-compatible with existing memories, the Mode0 and Mode1 inputs correspond to input pins not currently used in those prior art memories. As in previous embodiments, the mode pins have internal pull-ups holding them in the not asserted mode.

5.4 Benefits

Benefits of the invention include the ability to implement a multi-way set associative burst memory in a single device. The operational consequence of this is to improve system performance by providing set associative cache memory without incurring the cost of increasing the memory system's chip count or power requirements. In a preferred embodiment of the invention, the ability to accept a mode control input allows backwards compatibility with existing memory devices.

It will be appreciated by those of ordinary skill having the benefit of this disclosure that numerous variations from the foregoing illustration will be possible without departing from the inventive concept described herein. Accordingly, it is the claims set forth below, and not merely the foregoing illustration, which are intended to define the exclusive rights claimed in this application program.

What is claimed is:

1. A single memory device operatively coupled to function as an M-way set associative burst memory device where M is greater than one, comprising:

(a) an address latch configured to receive an a-bit external address signal and operatively coupled to output a b-bit burst counter input signal, a $(a-b-(\log_2 M))$-bit internal address signal, and a $(\log_2 M)$-bit bank select signal;

(b) a burst counter operatively coupled to receive the b-bit burst counter input signal and to output a b-bit burst counter output signal;

(c) M memory subarrays, each of the M memory subarrays operatively coupled to receive the $(a-b-(\log_2 M))$-bit internal address signal and the b-bit burst counter output signal, each said memory subarray further configured to receive a d-bit data signal;

(d) a read/write control circuit operatively coupled to each of the M memory subarrays, the bank select signal selectively enabling each of the M memory subarrays, the bank select signal consisting of at least one low order address bit;

(e) M d-bit output registers, each operatively coupled to a unique one of the M memory subarrays;

(f) M d-bit output buffers, each output buffer having an enable input and operatively coupled to a unique one of the M output registers; and (g) means for selectively enabling one of the M output buffers as a function of the $(\log_2 M)$-bit bank select signal.

2. The M-way set associative burst memory device of claim 1 wherein M=2, a=14, d=36, and where the means for selectively enabling the M=2 output buffers includes coupling the $(\log_2 M)$=1-bit bank select signal to the enable input on each of the M=2 output buffers.

3. The M-way set associative burst memory device of claim 1 wherein M=4, a=14, d=36, and where the means for selectively enabling the M=4 output buffers includes a means for decoding the $(\log_2 M)$=2-bit bank select signal into M=4 separate enable signals and for coupling each one of the M=4 separate enable signals to a unique one of the M=4 output buffers.

4. The M-way set associative burst memory of claim 1 wherein the M memory subarrays comprise SRAM type memory.

5. The M-way set associative burst memory device of claim 1 further comprising a backward compatibility circuit that allows said memory device to be backwards compatible with direct mapped memory devices.

6. A single memory device operatively coupled to function as a two-way set associative burst memory device configured to receive an a-bit address signal and a d-bit data signal, the memory device comprising:

(a) an address latch configured to receive the a-bit address signal and operatively coupled to output a 2-bit burst counter input signal, an (a−3)-bit internal address signal, and a 1-bit bank select signal;

(b) a burst counter operatively coupled to receive the 2-bit burst counter input signal and to output a 2-bit burst counter output signal;

(c) a first memory subarray operatively coupled to receive (1) the d-bit data signal and (2) an (a−1)-bit memory subarray address signal including the 2-bit burst counter output signal and the (a−3)-bit internal address signal;

(d) a second memory subarray operatively coupled to receive (1) the d-bit data signal and (2) the (a−1)-bit memory subarray address signal;

(e) a read/write control circuit operatively coupled to the first and second memory subarrays, the 1-bit bank select signal selectively enabling the first and second memory subarrays, the 1-bit bank select signal consisting of one low order address bit;

(f) a first d-bit output register operatively coupled to the first memory subarray;

(g) a second d-bit output register operatively coupled to the second memory subarray;

(h) a first d-bit output buffer, operatively coupled to the first d-bit output register and configured to receive the 1-bit bank select signal; and (i) a second d-bit output buffer, operatively coupled to the second d-bit output register and configured to receive the 1-bit bank select signal.

7. The two-way set associative burst memory device of claim 6, wherein a=14 and d=36.

8. The two-way set associative burst memory device of claim 6 wherein the first and second memory subarrays are SRAM type memory.

9. The two-way set associative burst memory device of claim 6 further comprising a backward compatibility circuit that allows said memory device to be backwards compatible with direct mapped memory devices.

10. A single memory device operatively coupled to function as a four-way set associative burst memory device configured to receive an a-bit address signal and a d-bit data signal, the memory device comprising:

(a) an address latch configured to receive the a-bit address signal and to output a 2-bit burst counter input signal, an (a−4)-bit internal address signal, and a 2-bit bank select signal;

(b) a burst counter operatively coupled to receive the 2-bit burst counter input signal and to output a 2-bit burst counter output signal;

(c) a first memory subarray operatively coupled to receive (1) the d-bit data signal and (2) a (a−2)-bit memory subarray address signal including the 2-bit burst counter output signal and the (a−4)-bit internal address signal;

(d) a second memory subarray operatively coupled to receive (1) the d-bit data signal and (2) the (a−2)-bit memory subarray address signal;

(e) a third memory subarray operatively coupled to receive (1) the d-bit data signal and (2) the (a−2)-bit memory subarray address signal;

(f) a fourth memory subarray operatively coupled to receive (1) the d-bit data signal and (2) the (a−2)-bit memory subarray address signal;

(g) a read/write control circuit operatively coupled to the first, second, third, and fourth memory subarrays, the 2-bit bank select signal selectively enabling the first, second, third, and fourth memory subarrays, the 2-bit bank select signal consisting of two low order address bits;

(h) a 2-bit decoder operatively coupled to receive the 2-bit bank select signal and to generate a first, second, third, and fourth enable output signal;

(i) a first d-bit output register operatively coupled to the first memory subarray;

(j) a second d-bit output register operatively coupled to the second memory subarray;

(k) a third d-bit output register operatively coupled to the third memory subarray;

(l) a fourth d-bit output register operatively coupled to the fourth memory subarray;

(m) a first d-bit output buffer, operatively coupled to the first d-bit output register and configured to receive the first output enable signal;

(n) a second d-bit output buffer, operatively coupled to the second d-bit output register and configured to receive the second output enable signal;

(o) a third d-bit output buffer operatively coupled to the third memory subarray and configured to receive the third output enable signal; and (p) a fourth d-bit output buffer operatively coupled to the fourth memory subarray and configured to receive the fourth output enable signal.

11. The four-way set associative burst memory device of claim 10, wherein a=14 and d=36.

12. The four-way set associative burst memory device of claim 10 wherein the first, second, third, and fourth memory subarrays are SRAM type memory.

13. The four-way set associative burst memory device of claim 10 further comprising a backward compatibility circuit that allows said memory device to be backwards compatible with direct mapped memory devices.

14. A computer system comprising:

(a) a processor;

(b) a dynamic random access memory; and (c) at least one single memory device operatively coupled to function as a two-way set associative burst memory device receiving an a-bit address signal and a d-bit data signal, said single memory device comprising:

(1) an address latch configured to receive the a-bit address signal, and to generate an output comprising a 2-bit burst counter input signal, an (a−3)-bit internal address signal, and a 1-bit bank select signal;

(2) a burst counter operatively coupled to receive the 2-bit burst counter input signal, and to generate an output comprising a 2-bit burst counter output signal;

(3) a first memory subarray operatively coupled to receive (1) the d-bit data signal and (2) an (a−1)-bit memory subarray address signal including the 2-bit burst counter output signal and the (a−3)-bit internal address signal;

(4) a second memory subarray operatively coupled to receive (1) the d-bit data signal and (2) the (a−1)-bit memory subarray address signal;

(5) a read/write control circuit operatively coupled to the first and second memory subarrays, the 1-bit bank select signal selectively enabling the first and second memory subarrays, the 1-bit bank select signal consisting of one low order address bit;

(6) a first d-bit output register operatively coupled to the first memory subarray;

(7) a second d-bit output register operatively coupled to the second memory subarray;

(8) a first d-bit output buffer, operatively coupled to the first d-bit output register and configured to receive the 1-bit bank select signal; and (9) a second d-bit output buffer, operatively coupled to the second d-bit output register and configured to receive the 1-bit bank select signal.

15. The computer system of claim 14 with a two-way set associative burst memory device wherein a=14 and d=36.

16. The computer system of claim 14 with a two-way set associative burst memory device wherein the first and second memory subarrays are SRAM type memory.

17. The computer system of claim 14 with a two-way set associative burst memory device further comprising a backward compatibility circuit that allows said memory device to be backwards compatible with direct mapped memory devices.

18. A computer system comprising:

(a) a processor;

(b) a dynamic random access memory; and (c) at least one single memory device operatively coupled to function as a four-way set associative burst memory device configured to receive an a-bit address signal and a d-bit data signal comprising:

(1) an address latch configured to receive the a-bit address signal and to output a 2-bit burst counter input signal, an (a−4)-bit internal address signal, and a 2-bit bank select signal;

(2) a burst counter operatively coupled to receive the 2-bit burst counter input signal and to output a 2-bit burst counter output signal;

(3) a first memory subarray operatively coupled to receive (1) the d-bit data signal and (2) a (a−2)-bit memory subarray address signal including the 2-bit burst counter output signal and the (a−4)-bit internal address signal;

(4) a second memory subarray operatively coupled to receive (1) the d-bit data signal and (2) the (a−2)-bit memory subarray address signal;

(5) a third memory subarray operatively coupled to receive (1) the d-bit data signal and (2) the (a−2)-bit memory subarray address signal;

(6) a fourth memory subarray operatively coupled to receive (1) the d-bit data signal and (2) the (a−2)-bit memory subarray address signal;

(7) a read/write control circuit operatively coupled to the first, second, third, and fourth memory subarrays, the 2-bit bank select signal selectively enabling the first, second, third, and fourth memory subarrays, the 2-bit bank select signal consisting of two low order address bits;

(8) a 2-bit decoder operatively coupled to receive the 2-bit bank select signal and to generate a first, second, third, and fourth enable output signal;

(9) a first d-bit output register operatively coupled to the first memory subarray;

(10) a second d-bit output register operatively coupled to the second memory subarray;

(11) a third d-bit output register operatively coupled to the third memory subarray;

(12) a fourth d-bit output register operatively coupled to the fourth memory subarray;

(13) a first d-bit output buffer, operatively coupled to the first d-bit output register and configured to receive the first output enable signal;

(14) a second d-bit output buffer, operatively coupled to the second d-bit output register and configured to receive the second output enable signal;

(15) a third d-bit output buffer operatively coupled to the third memory subarray and configured to receive the third output enable signal; and

(16) a fourth d-bit output buffer operatively coupled to the fourth memory subarray and configured to receive the fourth output enable signal.

19. The computer system of claim 18 wherein a=14 and d=36.

20. The computer system of claim 18 wherein the first, second, third, and fourth memory subarrays are SRAM type memory.

21. The computer system of claim 18 further comprising a backward compatibility circuit that allows said memory device to be backwards compatible with direct mapped memory devices.

22. A single memory device operatively coupled to function as a two-way set associative burst memory device configured to receive a 14-bit address signal and a 36-bit data signal, the memory device comprising:

(a) an address latch configured to receive the 14-bit address signal and operatively coupled to output a 2-bit burst counter input signal, an 11-bit internal address signal, and a 1-bit bank select signal;

(b) a burst counter operatively coupled to receive the 2-bit burst counter input signal and to output a 2-bit burst counter output signal;

(c) a first memory subarray operatively coupled to receive (1) the 36-bit data signal and (2) a 13-bit memory subarray address signal including the 2-bit burst counter output signal and the 11-bit internal address signal;

(d) a second memory subarray operatively coupled to receive (1) the 36-bit data signal and (2) the 13-bit memory subarray address signal;

(e) a read/write control circuit operatively coupled to the first and second memory subarrays, the 1-bit bank select signal selectively enabling the first and second memory subarrays, the 1-bit bank select signal consisting of one low order address bit;

(f) a first 36-bit output register operatively coupled to the first memory subarray;

(g) a second 36-bit output register operatively coupled to the second memory subarray;

(h) a first 36-bit output buffer, operatively coupled to the first 36-bit output register and configured to receive the 1-bit bank select signal; and (i) a second 36-bit output buffer, operatively coupled to the second 36-bit output register and configured to receive the 1-bit bank select signal.

23. A single memory device operatively coupled to function as a four-way set associative burst memory device configured to receive an 14-bit address signal and a 36-bit data signal, the memory device comprising:

(a) an address latch configured to receive the 14-bit address signal and to output a 2-bit burst counter input signal, an 10-bit internal address signal, and a 2-bit bank select signal;

(b) a burst counter operatively coupled to receive the 2-bit burst counter input signal and to output a 2-bit burst counter output signal;

(c) a first memory subarray operatively coupled to receive (1) the 36-bit data signal and (2) a 12-bit memory subarray address signal including the 2-bit burst counter output signal and the 10-bit internal address signal;

(d) a second memory subarray operatively coupled to receive (1) the 36-bit data signal and (2) the 12-bit memory subarray address signal;

(e) a third memory subarray operatively coupled to receive (1) the 36-bit data signal and (2) the 12-bit memory subarray address signal;

(f) a fourth memory subarray operatively coupled to receive (1) the 36-bit data signal and (2) the 12-bit memory subarray address signal;

(g) a read/write control circuit operatively coupled to the first, second, third, and fourth memory subarrays, the 2-bit bank select signal selectively enabling the first, second, third, and fourth memory subarrays, the 2-bit bank select signal consisting of two low order address bits;

(h) a 2-bit decoder operatively coupled to receive the 2-bit bank select signal and to generate a first, second, third, and fourth enable output signal;

(i) a first 36-bit output register operatively coupled to the first memory subarray;

(j) a second 36-bit output register operatively coupled to the second memory subarray;

(k) a third 36-bit output register operatively coupled to the third memory subarray;

(l) a fourth 36-bit output register operatively coupled to the fourth memory subarray;

(m) a first 36-bit output buffer, operatively coupled to the first 36-bit output register and configured to receive the first output enable signal;

(n) a second 36-bit output buffer, operatively coupled to the second 36-bit output register and configured to receive the second output enable signal;

(o) a third 36-bit output buffer operatively coupled to the third memory subarray and configured to receive the third output enable signal; and (p) a fourth 36-bit output buffer operatively coupled to the fourth memory subarray and configured to receive the fourth output enable signal.

* * * * *